United States Patent
Liu et al.

(10) Patent No.: US 11,946,159 B2
(45) Date of Patent: Apr. 2, 2024

(54) METHOD OF SELECTIVELY CONTROLLING NUCLEATION FOR CRYSTALLINE COMPOUND FORMATION BY IRRADIATING A PRECURSOR WITH A PULSED ENERGY SOURCE

(71) Applicant: Purdue Research Foundation, West Lafayette, IN (US)

(72) Inventors: Chunghorng Liu, West Lafayette, IN (US); Siyu Liu, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 17/992,819

(22) Filed: Nov. 22, 2022

(65) Prior Publication Data

US 2023/0116229 A1   Apr. 13, 2023

Related U.S. Application Data

(60) Division of application No. 16/699,459, filed on Nov. 29, 2019, now Pat. No. 11,505,877, which is a continuation-in-part of application No. 16/600,650, filed on Oct. 14, 2019, now abandoned.

(51) Int. Cl.
   *C30B 25/16*   (2006.01)
   *C30B 29/16*   (2006.01)

(52) U.S. Cl.
   CPC .............. *C30B 25/16* (2013.01); *C30B 29/16* (2013.01)

(58) Field of Classification Search
   CPC .. C30B 7/00; C30B 7/005; C30B 7/02; C30B 7/04; C30B 7/14; C30B 19/00; C30B 19/02; C30B 19/08; C30B 25/02; C30B 25/16; C30B 29/00; C30B 29/10; C30B 29/16; C30B 30/00
   USPC ... 117/11, 54, 56, 68, 75, 78, 103, 904, 921, 117/937, 944
   See application file for complete search history.

(56) References Cited

U.S. PATENT DOCUMENTS

2015/0047555 A1*   2/2015  Wang ..................... C30B 7/14
                                                                117/68

OTHER PUBLICATIONS

Liu, et al. publication entitled "Nucleation of hematite nanocrystals revealed by a single nanosecond laser pulse method," Nanoscale Communication, vol. 10, pp. 14400-405 (2018). (Year: 2018).*
Fauteux, et al. publication entitled "Fast synthesis of ZnO nanostructures by laser-induced decomposition of zinc acetylacetonate," Inorganic Chemistry, vol. 46, pp. 11036-47 (2007). (Year: 2007).*

(Continued)

*Primary Examiner* — Kenneth A Bratland, Jr.
(74) *Attorney, Agent, or Firm* — Piroozi-IP, LLC (57) ABSTRACT

A method of selectively controlling materials structure in solution based chemical synthesis and deposition of materials by controlling input energy from pulsed energy source includes determining solution conditions, searching and/or determining energy barrier(s) of a desired materials structure formation, applying precursor solution with selected solution condition onto a substrate, and applying determined input energy from a pulsed energy source with a selected condition to the substrate, thereby nucleating and growing the crystal.

9 Claims, 12 Drawing Sheets

(56) References Cited

OTHER PUBLICATIONS

Liu, et al. publication entitled "The mechanism of controlled integration of ZnO nanowires using pulsed-laser-induced chemical deposition," Nanoscale Communication, vol. 11, p. 2617 (2019). (Year: 2019).*

In, et al. publication entitled "In situ monitoring of laser-assisted hydrothermal growth of ZnO nanowires: Thermally deactivating growth kinetics," Small, vol. 10, No. 4, pp. 741-749 (2014). (Year: 2014).*

* cited by examiner

METHOD OF SELECTIVELY CONTROLLING NUCLEATION FOR CRYSTALLINE COMPOUND FORMATION BY IRRADIATING A PRECURSOR WITH A PULSED ENERGY SOURCE

CROSS REFERENCE TO RELATED APPLICATIONS

This patent application is a divisional of U.S. Non-Provisional patent application Ser. No. 16/699,459 filed Nov. 29, 2019, now U.S. Pat. No. 11,505,877 to Liu et al. which is a continuation-in-part application which is related to and claims the priority benefit of U.S. Non-Provisional patent application Ser. No. 16/600,650 filed 14 Oct. 2019, the contents of each of which are incorporated herein by reference into the present disclosure.

STATEMENT REGARDING GOVERNMENT FUNDING

This invention was made with government support under CMMI 1663214 awarded by the National Science Foundation. The government has certain rights in the invention.

TECHNICAL FIELD

The present disclosure generally relates to processes for manufacture of nano-scale and micro-scale structured materials, and more particularly, to processes of controlling crystal nucleation and growth.

BACKGROUND

This section introduces aspects that may help facilitate a better understanding of the disclosure. Accordingly, these statements are to be read in this light and are not to be understood as admissions about what is or is not prior art.

Nanomaterials synthesis with selective attributes and particularly crystal synthesis with morphologies of interest are commonplace nowadays. For example, desired size, orientation, crystallization structure on substrates are all attributes of crystal growth and deposition that skilled artisans seek to manipulate.

In conventional materials synthesis methods, chemical processes are widely used to control crystal growth, such as adjusting pH values of intermediate solutions, adding capping agents, etc., known to a person having ordinary skill in the art. However, these methods suffer from low synthesis efficiency. This low efficiency results from intrinsic features such as low production rate and or synthesis processes that can easily stray out of control, for example, slightly different pH environment can lead to nanomaterials product with dramatically different morphologies. Moreover, current nanomanufacturing processes involve multiple steps to create nanomaterials with desired morphology to meet various design specifications that is both time consuming and costly.

Therefore, there is an unmet need for a novel approach for nano-scaled crystal synthesis including crystal nucleation as well as crystal growth that does not suffer from the aforementioned shortcomings of the prior art.

SUMMARY

A method of selectively controlling nucleation for crystalline formation includes determining minimum energy barriers of a desired crystal formation by stepped increasing the pulsed laser condition. The method includes applying the selected precursor solution having a selected condition on to substrate. Furthermore, the method includes applying pulsed laser as an pulsed energy source with predetermined input energy at least at the minimum energy barrier to the substrate, thereby nucleating the crystal. The selected input energy of the pulsed laser is defined by a laser condition of any combination of the following setting: laser energy (fluence), laser irradiation area, repetition rate, pulse width (or duration per pulse), and total time of pulsations of this condition.

Another method for selectively growing crystals is also disclosed. The method includes applying the selected precursor solution having a selected condition on to the pre-nucleated substrate. Then the method includes determining the minimum energy for a desired crystal growth and the maximum energy of growing crystals without additional nucleation, by stepped increasing the pulsed laser condition. The determined input energy of the pulsed laser is defined by a laser condition of any combination of the following setting: laser fluence, laser irradiation area, repetition rate, pulse width (or duration per pulse), and total time of pulsations. In addition, the method includes applying the determined input energy from a pulsed laser to a nucleated crystalline compound provided on a substrate for a predetermined amount of time. The crystal growth is controlled i) kinetically, or ii) thermodynamically.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel approach for nano-scaled crystal synthesis including crystal nucleation as well as crystal growth is presented that does not suffer from the aforementioned shortcomings of the prior art. The present disclosure presented use of a controllable pulsed energy source such as a pulsed laser that controls material deposition in a precise manner. The present disclosure covers the ideas of using pulsed laser as a tool for controlled delivery of specific energy density per unity of area required for achieving needed nucleation conditions and growth conditions respectively. Continuous wave laser may be used with added controls. The present disclosure presented use pulsed laser that controls materials produced by on-site synthesis and deposition based on four prongs. Firstly, pulsed laser provides input energy with high precision, therefore, the driving force of crystal nucleation and growth is controlled in precise quantitative manners. Secondly, since pulsed laser inputs large dose of energy during a short period of irradiation time; accordingly, thermodynamic and kinetic states of deposition alter, which generate novel reaction pathways. Thirdly, pulsed-laser is a precise tool with high resolution that provide spatial and temporal control. Thereby, pulsed-laser provides selective change in the deposition condition in a localized region. Lastly, the controlled method by pulsed laser for nanomaterials deposition is through thermodynamic and kinetic pathways, which can realize both catalytic and catalyst-free processes during nucleation and crystal growth.

To these ends, the present disclosure provides a controlled synthesis method to control materials structure by pulsed laser induced chemical deposition. In the synthesis, pulsed laser conditions are selected to adjust input energy then to control both initial crystal seeds in the nucleation process and crystal growth followed the nucleation process. The method of the present disclosure provides controlling materials structure which include providing a solution in a specific pH value and comprising precursor reactants which could be below saturated condition. The present disclosure also teaches how to select different laser conditions to achieve an input energy for the desired materials structure. The materials structure includes crystal size in three dimensions, density, crystalline structure, crystal orientation, and the shape of the crystal product. The present disclosure also teaches how to control synthesis process in the initial nucleation step and the crystal growth thereafter. In nucleation step, adjusting input energy of pulsed laser to overcome the lowest energy barriers for nucleation leads to heterogenous nucleation with uniform crystal orientation. In crystal growth steps, adjusting input energy of pulsed laser tunes the crystal growth kinetics (growth rate) and leads to different material morphologies. A particular input energy of pulsed laser is determined by a laser condition of a combination of laser fluence, irradiation area, repetition rate, width (duration) of a pulse, and total time (or total number of pulses).

Therefore, as discussed above, pulsed laser is used to selectively overcome the energy barriers for chemical deposition to initiate reaction for a certain morphology in a selected region. The method of control by pulsed laser applies to both the initial crystal formation in nucleation process and in crystal growth followed.

In classical nucleation theory, when a crystal is initially formed it could be regarded as a droplet. The Gibbs free energy $\Delta G$ of a droplet (assuming in spherical shape) is described as in following:

$$\Delta G = \frac{3}{4}\pi r^3 \Delta G_v + 4\pi r^2 \gamma$$

where $\Delta G_v$ is the bulk energy,
$\gamma$ is the surface energy also referred to as the resistance force for nucleation, and
r is the radius of the droplet. $\Delta G_v$ is often referred to as the driving force of nucleation. The difference in bulk free energy between product and reactant is related to saturation of solution which is expressed as:

$$\Delta G_v = kT\ln\frac{C}{C_0}$$

where C is the concentration of a solution,
$C_0$ is the concentration of a solution when it is saturated,
k is the Bolzmann constant, and
T is temperature.

Figure 1:
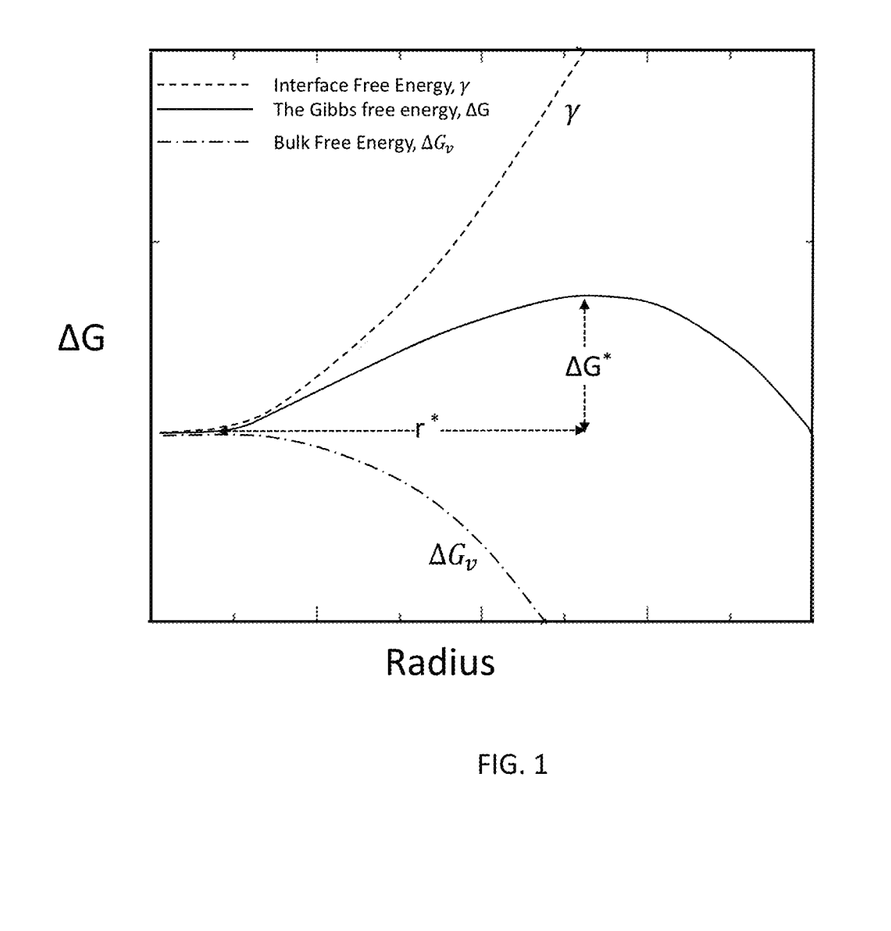
FIG. 1 is a diagram of Gibbs free energy vs. radius of nucleation, showing graphs of interface free energy, $\Delta G$, and bulk free energy.

The Gibbs free energy change with crystal radius is shown in FIG. 1. Referring to FIG. 1, a diagram of Gibbs free energy is provided vs. radius of nucleation, showing graphs of interface free energy, $\gamma$, the Gibbs free energy, $\Delta G$, and bulk free energy, $\Delta G_v$. The maximum value of free energy is the energy barriers for nucleation $\Delta G^*$, when $$\frac{dG}{dr} = 0.$$

Correspondingly, the value of r* at the energy barrier is the critical size of nucleation, after which addition of new molecules to nuclei decreases the free energy, so nucleation is more probable.

Figure 2A:
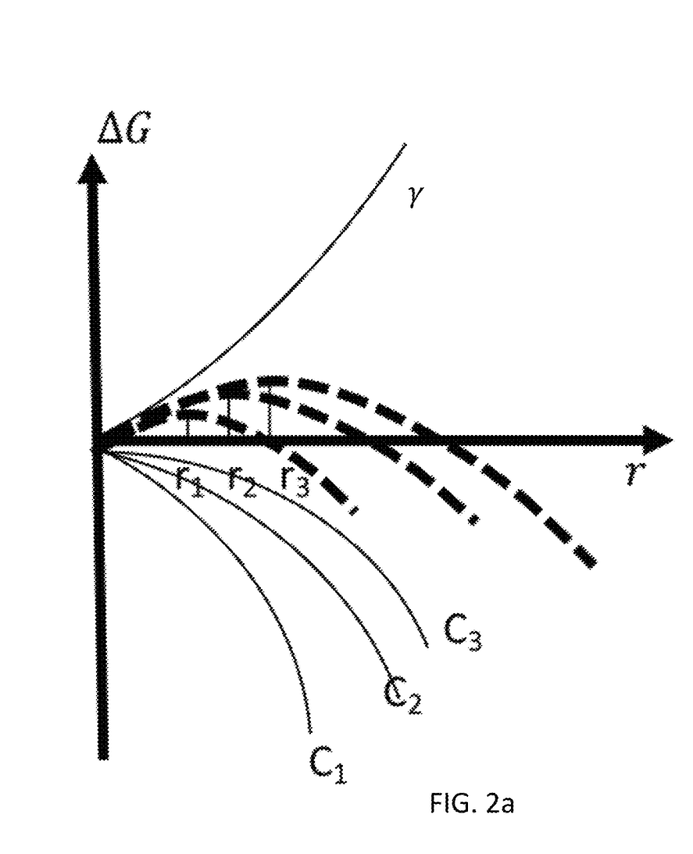
FIG. 2a is a graph of Gibbs free energy vs. radius in precursor solution with different concentration C.
Figure 2B:
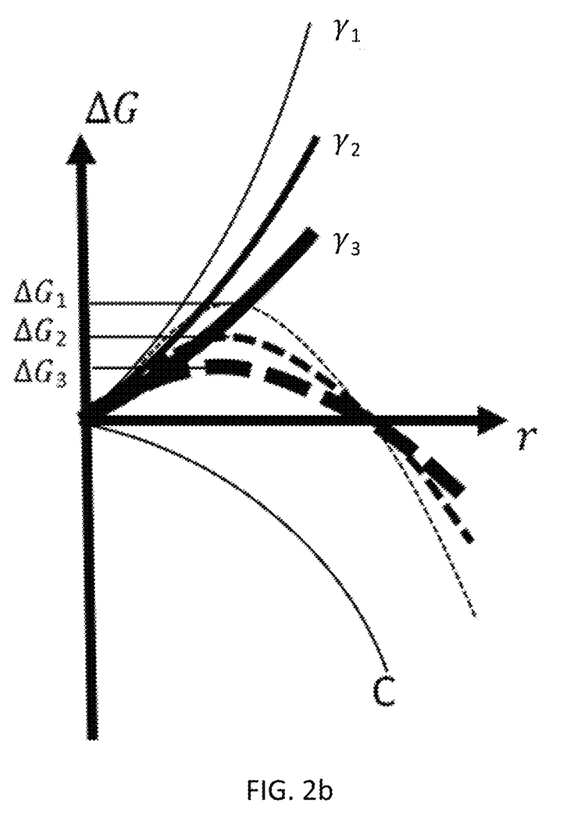
FIG. 2b is a graph of Gibbs free energy vs. radius for crystals with different surface energy, $\gamma$.

Effects of precursor concentration, C, and nuclei morphologies with different surface energy $\gamma$, on the Gibbs free energy for nucleation is showing in FIGS. 2a and 2b. Increase in the precursor concentration will lower the energy barrier height and therefore reduce the critical size. As shown in FIG. 2a, supposing that precursor concentration $C_1 > C_2 > C_3$, which will lead to the corresponding critical size are $r_1$, $r_2$, and $r_3$, where $r_1 < r_2 < r_3$. As to crystals with different morphologies, the shape with lowest surface energy will have lowest energy barriers, if the concentration of solution is kept the same. As shown in FIG. 2b, supposing that total surface energies of three different shape follow the sequence of $\gamma_1 > \gamma_2 > \gamma_3$, the corresponding energy barriers will be $\Delta G_1 > \Delta G_2 > \Delta G_3$.

By changing the precursor concentration, the critical size for nucleation can be selectively chosen. Specifically, higher concentration will lead to smaller initial crystal size, and lower concentration will lead to larger initial crystal size. Also, as shown in FIG. 2a, lower concentration leads to increase in energy barrier height. This attribute can be used to adjusting laser input energy. Specifically, with laser induced chemical deposition, different energy barriers can be overcome by adjusting laser input energy. Therefore, in condition with lower concentration level, initial crystals will have large size and a larger pulsed laser energy is needed.

Furthermore, different crystal planes have different surface energy, as initial crystals have different levels of total surface energy and energy barriers. The energy diagram is shown in FIG. 2b. Adjusting laser energy to overcome different level of energy barriers, initial crystals will have different morphologies, and morphologies of initial crystals determine the morphology of the product.

Figure 3:
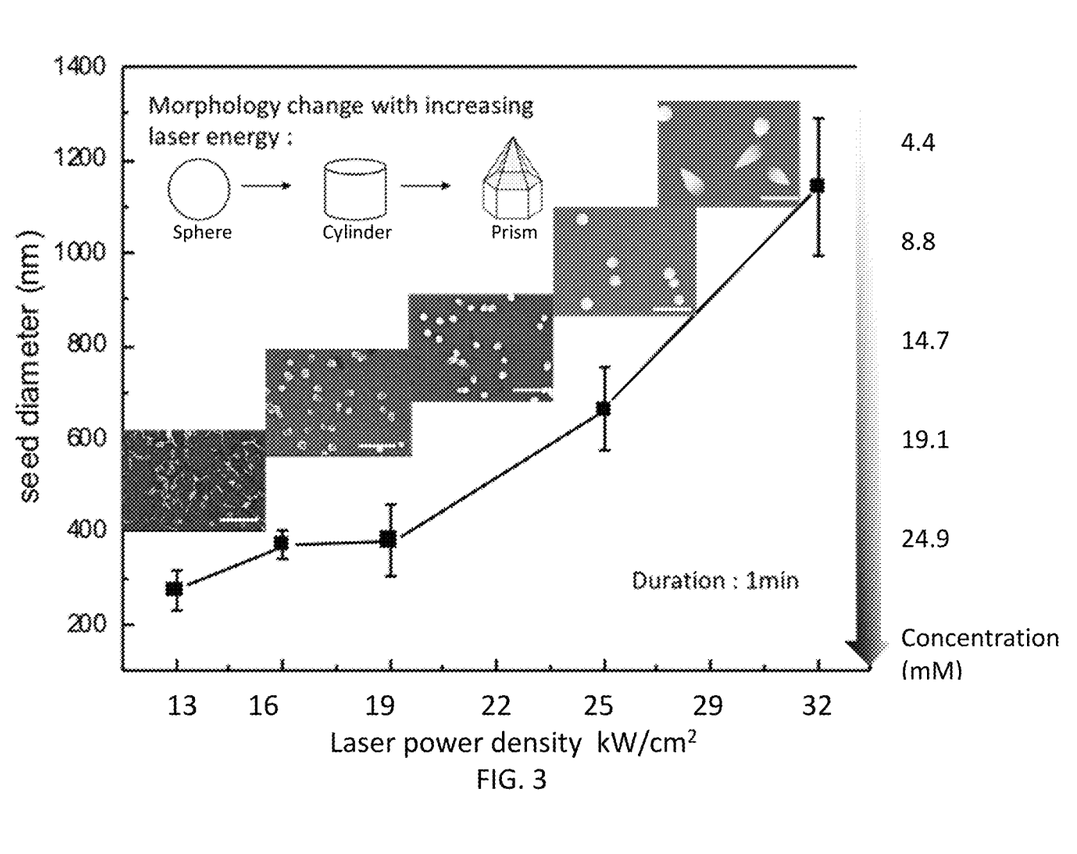
FIG. 3 is a graph of seed diameter in nm (nucleation) vs. laser power density in $kW/cm^2$ and precursor solution condition (precursor concentration in mM).

To better illustrate the methodology of the present disclosure, ZnO crystal formation is used as an example. A precursor solution was applied on silicon substrate by immersing substrate in precursor solution, which contains precursor reactants of zinc chloride to hexamethylene tetramine (HMTA) in content ratio of 1:1. Stepped increasing laser input energy by increasing laser power density until the deposition spot could be observed, then the laser input energy is regarded as just overcoming the lowest energy barrier for nucleation. Initial crystals with different materials structure is shown in FIG. 3, showing a graph of crystals in nucleation diameter in nm is provided vs. laser power density in kW/cm², and with precursor solution in different level of concentration. Different morphologies are shown for each corresponding power and seed diameter. Increasing the laser power density, changes the initial crystal morphology from sphere to hexagonal prism, and crystal size increase with precursor concentration decrease and laser power increase accordingly. In FIG. 3, all scales represent 2 μm in length.

Having discussed size of nucleation, orientation of the nucleation is now discussed. Orientation of initial crystals are controlled in nucleation step by laser induced chemical deposition, without the need of pre-deposition of seed layer or specific crystal structure of substrates. Orientation of initial crystals determine the final nanomaterials orientation as the crystals are grown. According to the classical nucleation theory, the energy barriers $\Delta G_{hom}$ of homogenous nucleation is described by $$\Delta G_{hom} = \frac{16\pi\gamma^3}{3(\Delta G_v)^2}$$

The energy barriers for heterogeneous nucleation are $$\Delta G_{het} = \Delta G_{hom} f(\theta)$$

which is smaller than homogeneous nucleation due to the structure factor $f(\theta)$. $f(\theta)$ is provided as follows:

$$f(\theta) = (2 - 3\cos\theta + \cos^3\theta)/4$$

where θ is the constant angle between nuclei and substrate, as shown in FIG. 4d, discussed further below.

Figure 4A:
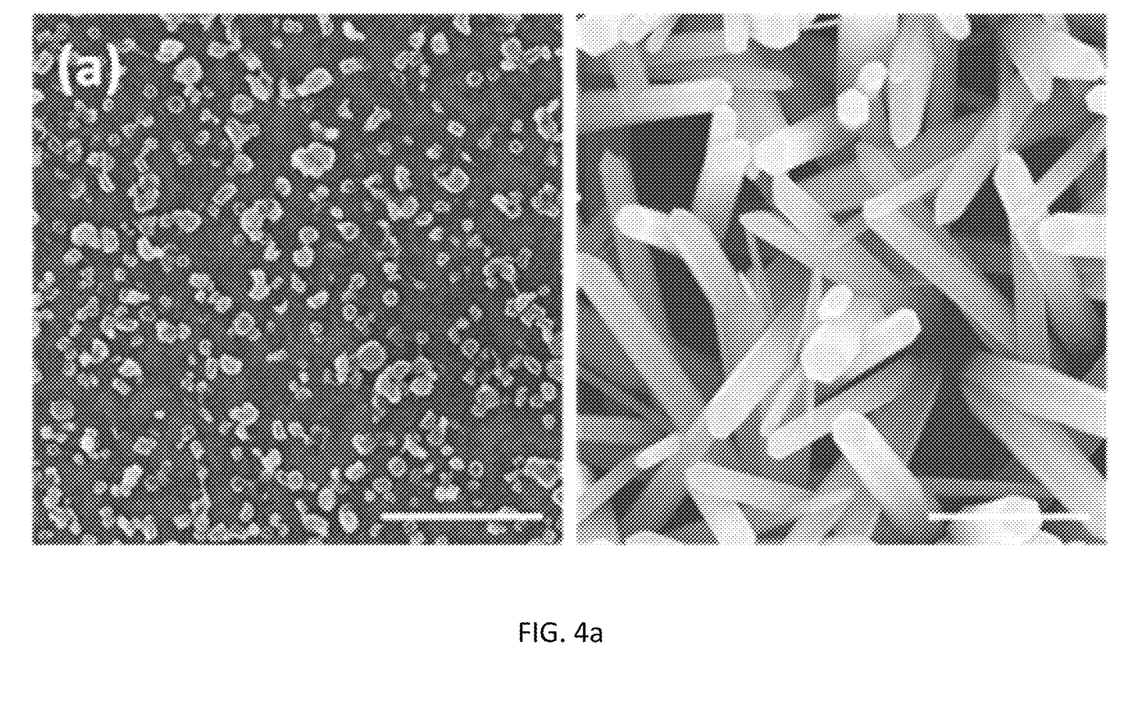
FIGS. 4a, 4b, and 4c are scanning electron microscopy (SEM) images of nucleation (left) and corresponding crystal growth (right) under laser irradiation of 0.5 mJ/pulse (FIG. 4a), 0.25 mJ/pulse (FIG. 4b), and 0.1 mJ/pulse (FIG. 4c), all scale bars representing 1 μm in length.
Figure 4B:
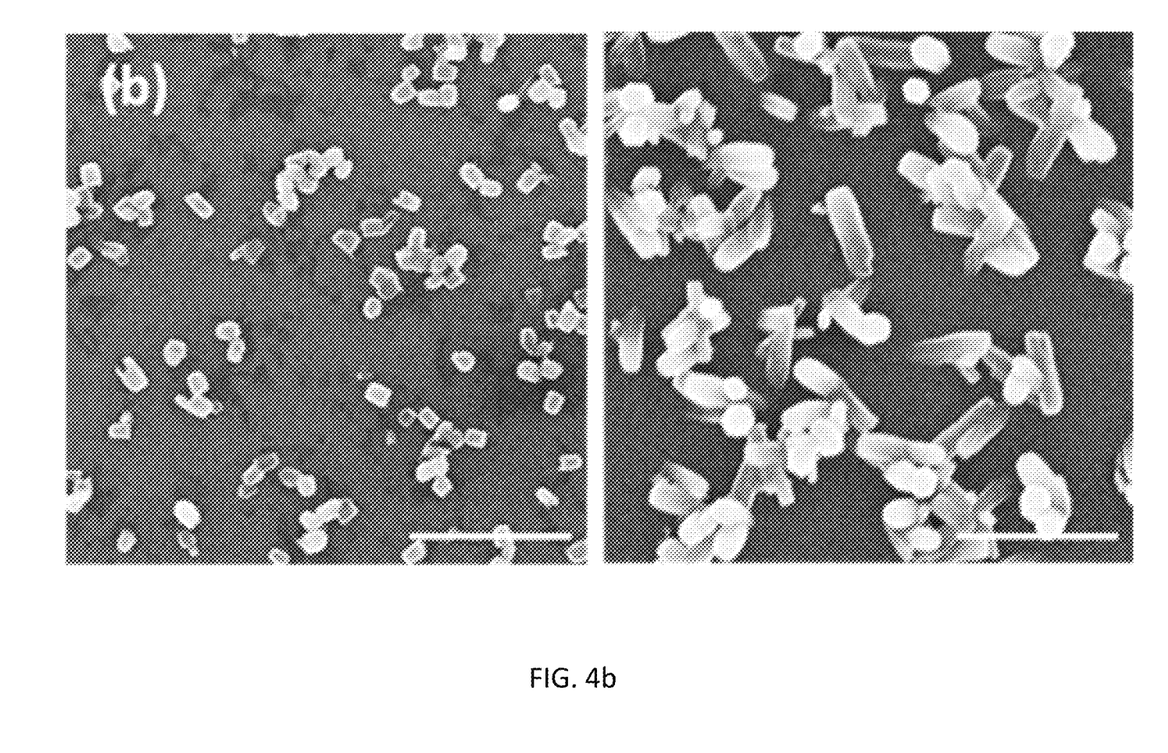
Figure 4C:
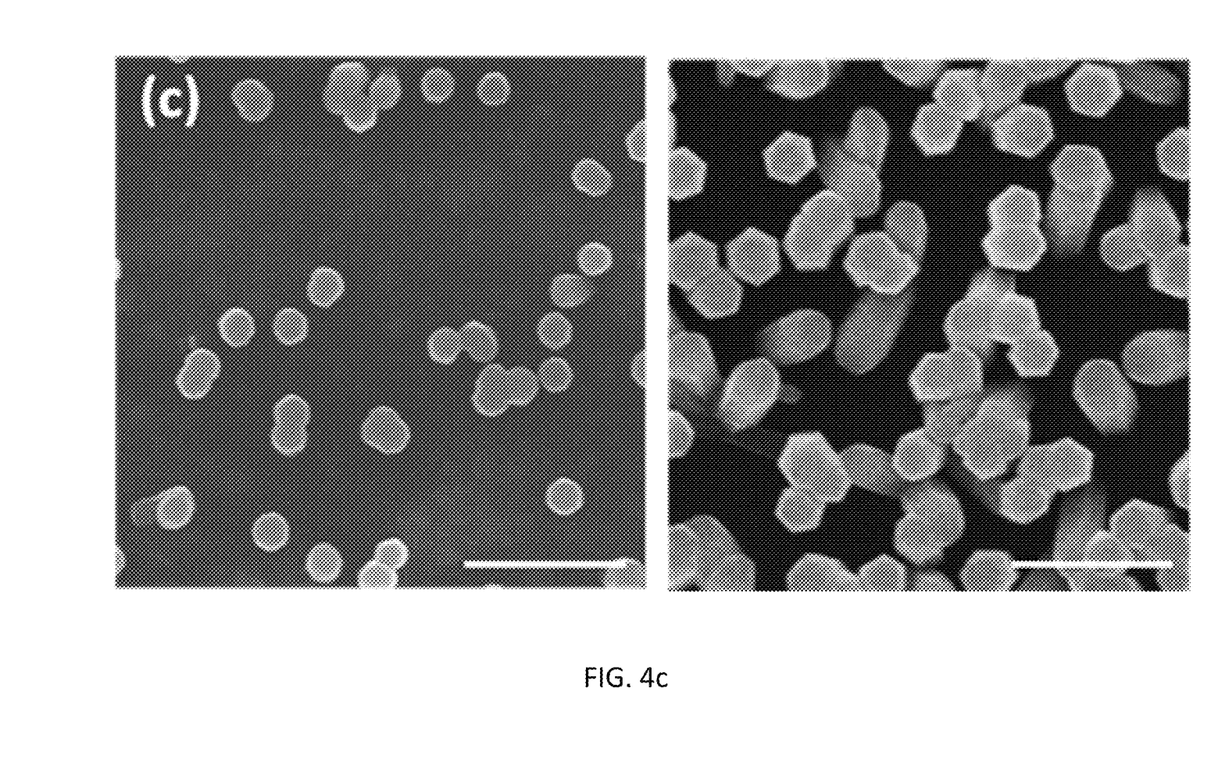
Figure 4D:
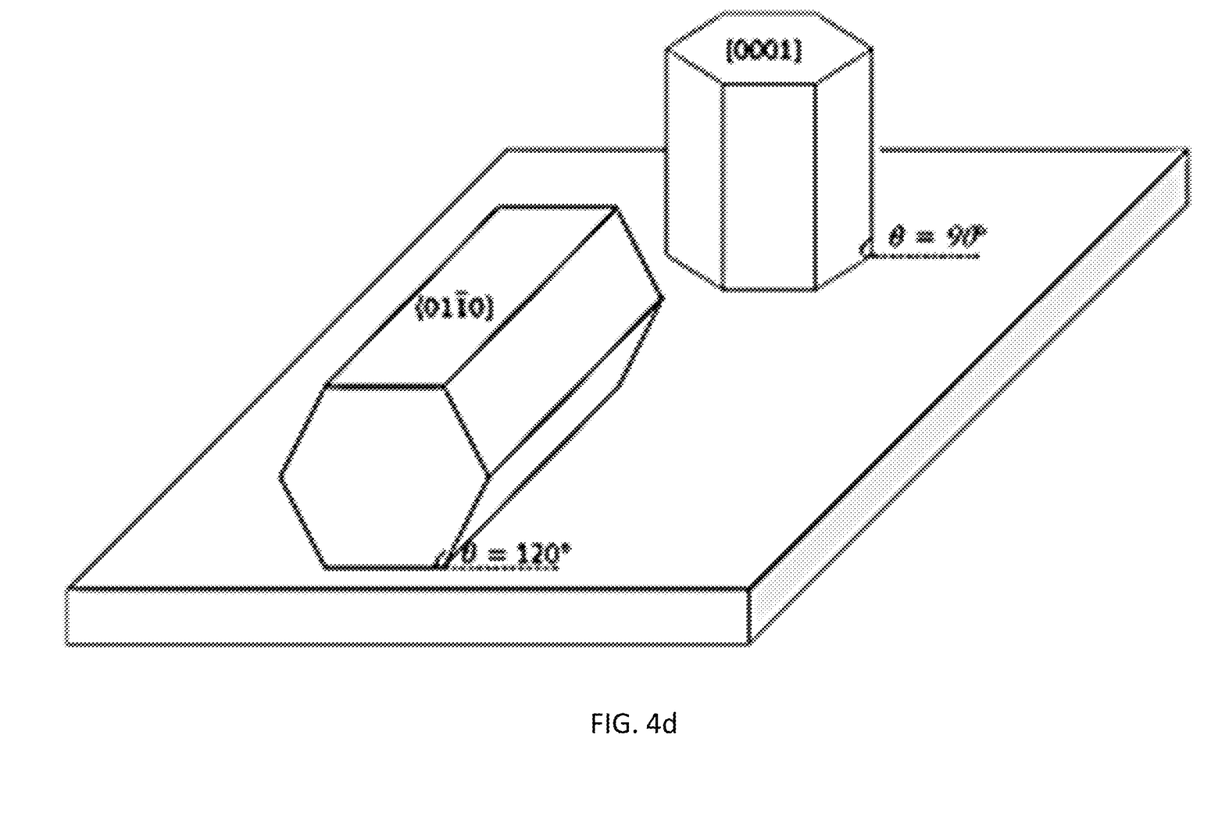
FIG. 4d is a schematic diagram of heterogeneous nucleation in (0001) plane with contact angle θ=90° and in {01$\bar{1}$0} planes with θ=120°.

Referring to FIGS. 4a, 4b, and 4c, scanning electron microscopy (SEM) images of nucleation (left) and corresponding crystal growth (right) under laser irradiation of 0.5 mJ/pulse (FIG. 4a), 0.25 mJ/pulse (FIG. 4b), and 0.1 mJ/pulse (FIG. 4c) are provided, in which the laser beam size is 200 μm. Referring to FIG. 4d, a schematic diagram of heterogeneous nucleation in (0001) plane with contact angle θ=90° and in {01$\bar{1}$0} planes with θ=120° are shown. As before, the present disclosure is exemplified with ZnO crystals. Heterogeneously nucleated with (0001) facet contacting with substrate, the structure factor would be $f(\theta)=f(90°)=0.5$. If it is nucleated with (01$\bar{1}$0) surface, the contact angle would be 120° and energy barrier would be 0.843 $\Delta G_{hom}$. So the energy barriers under different conditions will have the relationship of $\Delta G_{hom} > \Delta G_{het\_random} > \Delta G_{het\_(0001)}$. The experimental results are corresponding to the classical nucleation theory. By adjusting the laser input energy just above the minimum energy barriers $\Delta G_{het\_(0001)}$, which corresponding to the heterogeneous nucleation with (0001) planes attaching to the substrate, nanorod (the final product in this case) with orientation of [0001] perpendicular to the substrate are obtained.

With reference back to FIGS. 4a, 4b, and 4c, all scale bars represent 1 μm in length. By changing the input energy in a step of 0.05 mJ/pulse, the energy barriers of different nucleation processes could be determined. It was observed in our experiment that large input energy of 0.5 mJ/pulse will lead to homogeneous nucleation, and the crystal grown from the homogeneous nuclei will be randomly oriented, as shown in FIG. 4a. Decreasing the laser power to 0.25 mJ/pulse, nucleation will transfer from homogeneous to heterogeneous way. Only single layer of crystals formed on the substrate surface but without orientation preference shown, so the crystals growth afterwards was also in single layer but randomly oriented (as shown in FIG. 4b). If the laser power decreased to the level just above the threshold of nucleation, below which nucleation will not be triggered, as 0.1 mJ/pulse determined in the experiments according to the present disclosure, most nuclei have their c-axis ([0001] direction) perpendicular to the substrates, and the corresponding NWs have up-straight orientation (as shown in FIG. 4c).

Figure 5A:
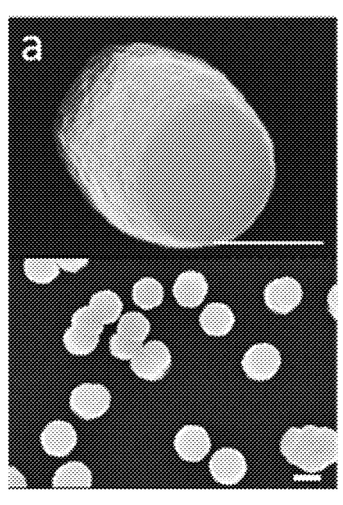
FIGS. 5a, 5b, 5c, and 5d are SEM images of grown ZnO crystal using the methods of the present disclosure, grown under laser power density of about 9.55 $kW/cm^2$ (FIG. 5a), about 15.92 $kW/cm^2$ (FIG. 5b), about 22.29 $kW/cm^2$ (FIG. 5c) and about 28.66 $kW/cm^2$ (FIG. 5d) all at about 200 kHz for about 5 min, with scale bars representing 500 nm in length.
Figure 5B:
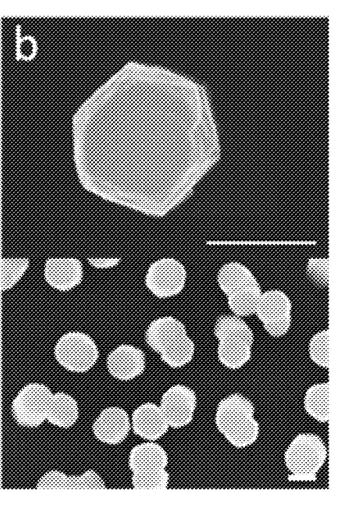
Figure 5C:
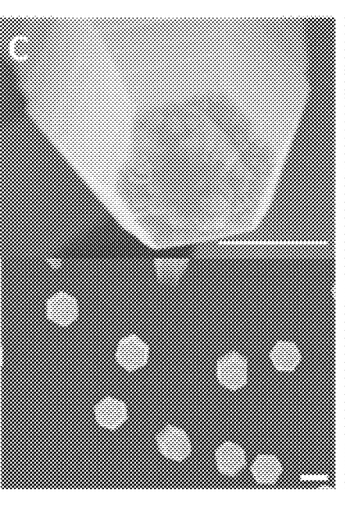
Figure 5D:
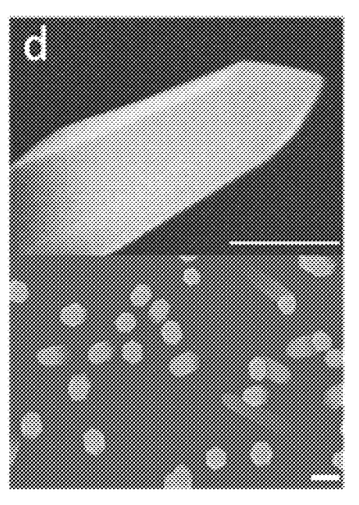
Figure 5E:
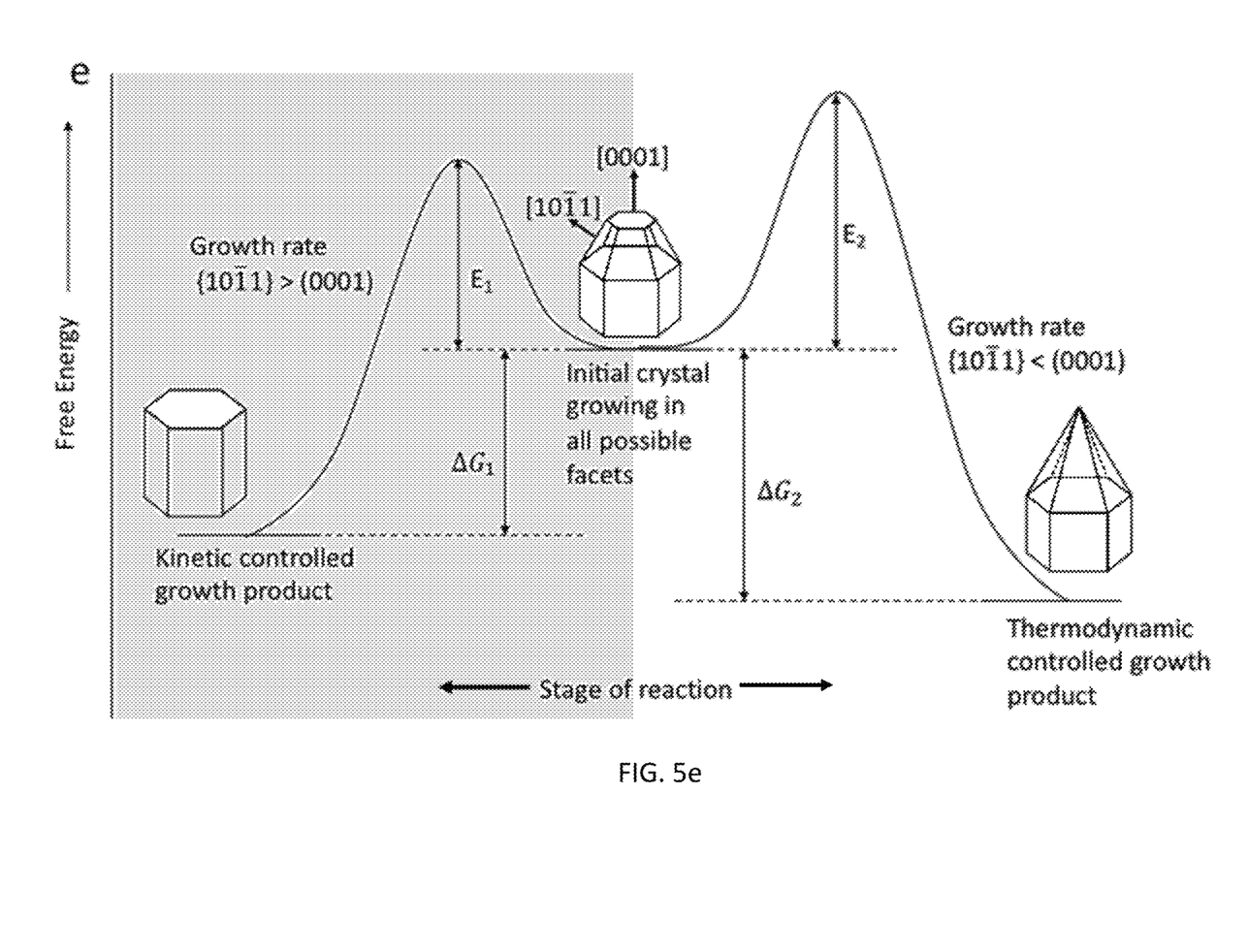
FIG. 5e is a schematic of crystal growth in kinetic controlled and thermodynamic controlled processes (as marked in the corresponding panels).

Once the initial crystal is formed, the crystal is then selectively grown under these conditions. According to the present disclosure, using a pulsed-laser methodology, crystal morphology is controlled in a more precise manner. Actual reduction to practice results showed that a specific crystal structure occurs only if a certain input energy level was reached by laser. By selectively setting the laser power, the crystal will grow with a desired morphology. Using ZnO crystals as example, when the input power is below about 9.55 kW/cm², all crystal surfaces were activated in a very low rate, and the crystal would undergo a homogenous growth and result in a spherical structure. Reference is made to FIGS. 5a, 5b, 5c, and 5d where SEM images of ZnO crystal growth are shown. Specifically, SEM images of ZnO crystals grown under laser power density of about 9.55 kW/cm² (FIG. 5a), about 15.92 kW/cm² (FIG. 5b), about 22.29 kW/cm² (FIG. 5c) and about 28.66 kW/cm² (FIG. 5d) at about 200 kHz for about 5 min. All scale bars represent 500 nm in length. FIG. 5e shows a schematic of crystal growth in kinetic controlled and thermodynamic controlled processes (as marked in the corresponding panels). Increasing the power from about 9.55 kW/cm² to about 15.92 kW/cm², the energy barriers for growth of prismatic planes (m-planes) were overcome, resulted in a transformation from cylinder to hexagonal shape as shown from FIGS. 5a to 5b. It indicated that the energy barriers of growth along <10$\bar{1}$1>, <10$\bar{1}$0> are overcome but not [0001] (c-axis).

Therefore, the growth rate of $\{10\bar{1}1\}$ planes is higher than (0001), which results in a flat surface on the crystal tip. When the pulsed laser power is increased to about 22.29 kW/cm², crystals would grow along the preferred orientation of c-axis. These SEM images show that energy barriers of growth of (0001) planes were overcome, so that the growth rate of (0001) plans increased dramatically and led crystal to grow longer. As shown in FIGS. 5c and 5d, when the pulsed laser power increased above 22.29 kW/cm², the tip did not grow smooth but instead was bounded by hillocks which were composed of faces of higher Miller indices and tips of crystals tend to approach $\{10\bar{1}1\}$. Faces of hillocks have lower specific surface free energy than (0001), so that these higher Miller indices faces predominate. When the pulsed laser power was above about 28.66 kW/cm², (0001) surface had the highest growth rate that leaded to a pyramid-like crystal structure. It is worth noting that it is the peak power rather than the accumulated energy that overcome the energy barriers. Evidence of this statement could be found that the certain morphology grown under specific high power-density that will not occur in the condition of irradiation by lower power accumulated for longer time, even though the total input energy is the same. For example, the total irradiation energy by laser power density of about 15.92 kW/cm² for 1.4 min is the same with about 22.29 kW/cm² irradiation for 1 min. However, the hillocks structure which indicated the activation of burst growth along [0001] direction, was not found in laser condition of about 15.92 kW/cm², even when irradiated for 40 min.

As shown in the reaction in corresponding panels in FIG. 5e, two paths could be identified by laser induced crystal growth. In kinetic controlled path, the crystal is controlled by energy barriers of growth along specific surfaces. The crystal growth is generally regarded as a process of 2D nucleation of island on the terraces followed by lateral motion of steps. The 2D nucleation of island is similar to initial heterogeneous nucleation, in which the free energy barrier E, relates to surface energy of specific plane, $$E \propto \frac{\gamma^3}{\Delta G_v^2} \cdot \gamma$$

has different values along different planes. Surface energy of prismatic planes $\{10\bar{1}0\}$ is 1.15 J/m², and 1.37 J/m² for $\{10\bar{1}1\}$ planes, and for the basal plane surface (0001) is 2.0 J/m². Therefore, the energy barriers for crystal growth of planes are in order of $\{0001\}>\{10\bar{1}1\}>\{10\bar{1}0\}$. Results from the actual reduction to practice showed that the occurrence of crystal planes with increasing input energy followed the sequence of $\{10\bar{1}0\}$, $\{10\bar{1}1\}$, $\{0001\}$, which was in the same order of surface energy values cited above. When the input energy is not large enough to overcome the energy barriers of 2D nucleation on all crystal planes, then certain planes with low energy barriers will be formed first, and planes with higher energy barriers not overcome will grow at a low rate. For example, when the input power is below about 22.29 kW/cm², large enough to induced growth along <$10\bar{1}1$> but not enough to overcome the energy barriers of 2D nucleation on (0001) surface, the crystal growth process is limited by kinetic factors of (0001), so that the growth rate of $\{10\bar{1}1\}$ is larger than (0001), and results in a hexagonal morphology with a flat surface on the tip (as shown in FIG. 5b and illustrated in the corresponding panel of FIG. 5e). When the input energy increases and is able to overcome the energy barriers of growth along all planes, the surface reaction is not the limiting factor and the growth of (0001) is no longer inhibited. In this circumstance, crystal growth will undergo a thermodynamic controlled pathway, as illustrated in reaction in the corresponding panel of FIG. 5e, where the product with largest Gibbs energy ΔG will be preferred to form because it is the most thermodynamic stable state. The Gibbs energy ΔG reaches maximum when the total surface energy ΣγA of crystal remains minimum as crystal grows. It could be measured by the increase of surface energy per volume dΣγA/dv. As calculated, dΣγA/dv is about 12.69 J/m in hexagonal structure and about 10.63 J/m in a pyramid-like structure on crystal tip. The pyramid-like structure is more stable than hexagonal structure in thermodynamic controlled reaction. Therefore, when the input energy is high enough (above about 28.66 kW/cm²), the ZnO crystal will have the morphology of the pyramid-like structure on the tip (as shown in FIG. 5d).

Figures 6A, 6B:
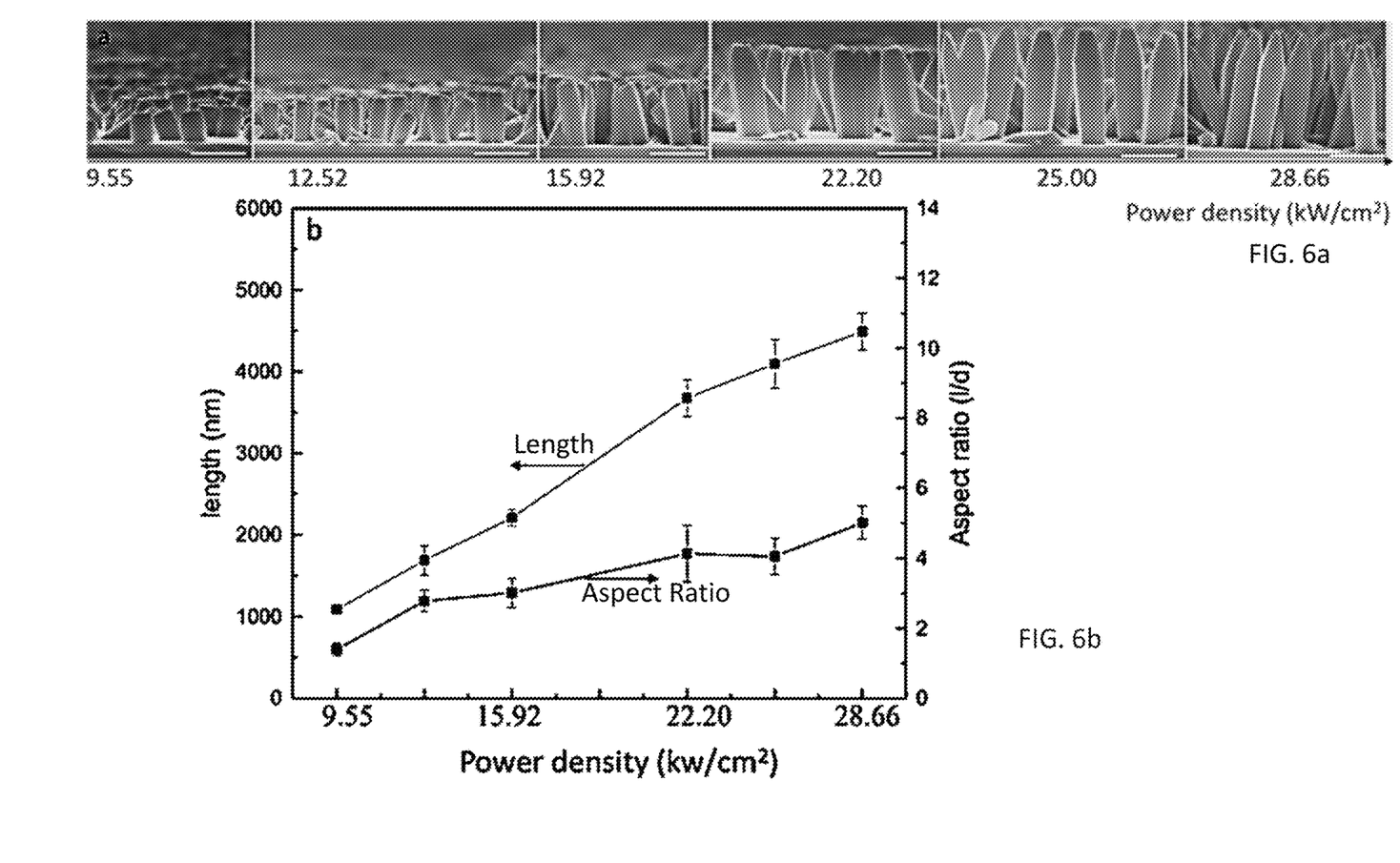
FIG. 6a is a sequence of SEM cross-sections images of nanorod crystals grown under power density from about 9.55 to about 28.66 $kW/cm^2$ at about 200 kHz for about 5 mins, with all scale bars representing 2 μm.
FIG. 6b provides graphs of length in nm and aspect ratio of nanorod crystals vs. power density in $kW/cm^2$.

According to the present disclosure, nanomaterials could be deposited in a high rate controlled by pulsed laser. Using ZnO crystals as examples, (0001) planes (top surfaces) have higher growth rate than $\{01\bar{1}0\}$ planes (cylindrical surfaces), and higher power-density results in higher growth rate. Referring to FIG. 6a, SEM cross-sections images of nanorod crystals grown under power density from about 9.55 to about 28.66 kW/cm² at 200 kHz for 5 mins are shown, with all scale bars representing 2 μm. Referring to FIG. 6b, corresponding graphs of length in nm and aspect ratio of nanorod crystals vs. power density in kw/cm² are provided. ZnO crystals grow into nanorods with different length. The anisotropic morphology could be described by the aspect ratio, length/diameter (l/d), as shown in FIG. 6b. Increasing the laser power density from 9.55 kW/cm² to 28.66 kW/cm², the length of ZnO crystals increases from 1.09 to 4.49 μm, and the aspect ratio increase from 1.40 to 5.01.

Figure 7A:
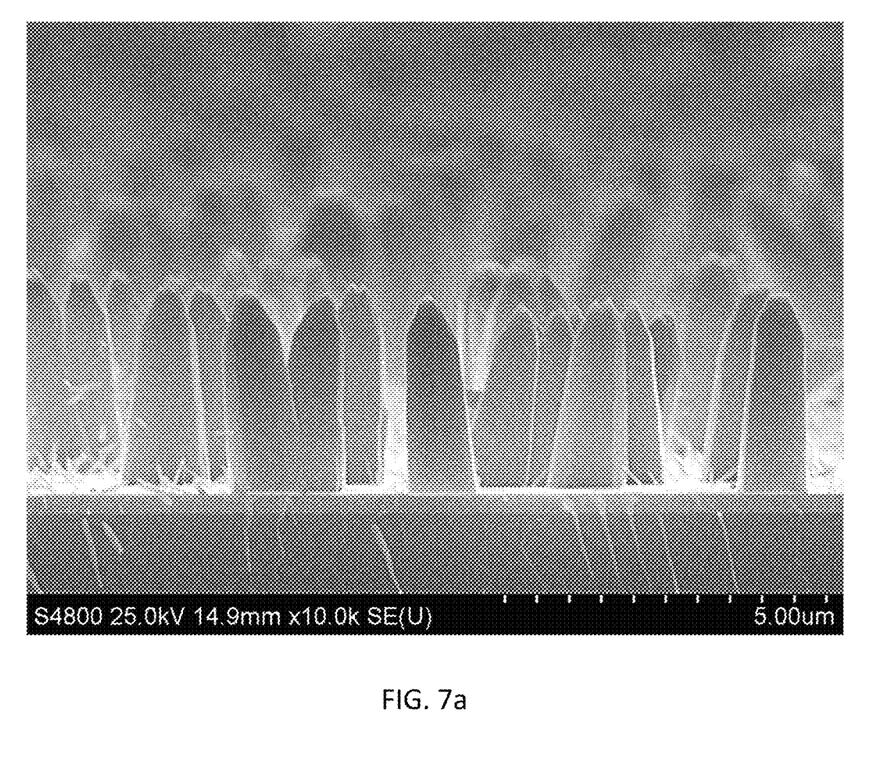
FIG. 7a is an SEM image of ZnO crystals with (0001) face up deposited on silicon substrate with an amorphous $SiO_2$ layer.
Figure 7B:
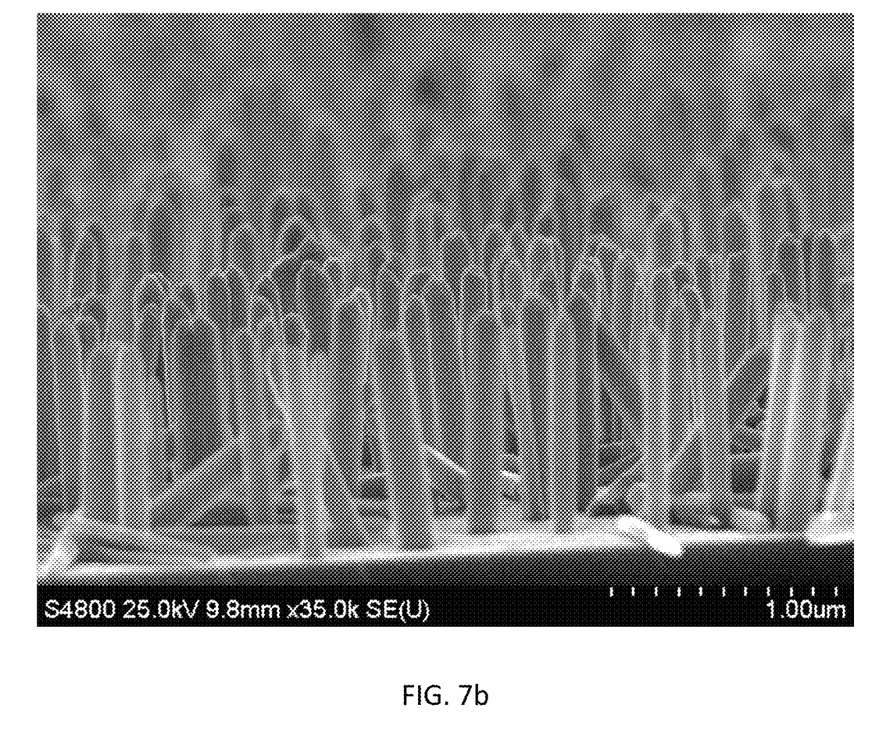
FIG. 7b is an SEM image of deposited ZnO crystals with a majority of the crystal in (0001) face up free-standing on silicon substrate.

According to one embodiment of the present disclosure, a route for pulsed laser synthesis of free-standing ZnO nanorod crystals, as shown in FIG. 7a and FIG. 7b, which presents an SEM image of ZnO crystals with (0001) face up deposited on silicon substrate with/without an amorphous SiO₂ layer. Neither catalyst nor specific requirement of substrate is needed. Accordingly, the process below is one example of a laser-pulsed methodology according to the present disclosure.

An exemplary controlled synthesis comprise steps of:
(1) Immersing a substrate in precursor solution containing precursor reactants;
(2) Determining the laser input energy by stepped increasing laser power density, when the deposition materials could be detected or observed, set the condition as laser input energy which just overcoming lowest Gibbs free energy barriers for nucleation;
(3) Irradiate substrate with laser beam for a total irradiation time with determined laser input energy to deposit initial crystals (seeds);
(4) Immersing the substrate in precursor solution with a different condition;
(5) Determining the laser input energy by stepped increasing laser power density: when the color of nucleated crystals get darker than original crystals (crystal size is detected larger), set the condition as lower bound for input energy; when the net deposition area is to become larger than original nucleated crystal seeds area (additional nucleation start to occur outside of existing crystals), set the condition as upper bound condition for crystal growth;
(6) Irradiate initial crystals on substrate for a total irradiation time based on desired crystal size, with determined laser input energy between lower and upper bound to grow following crystals.

Specific conditions in previous steps described above, for the case of ZnO presented, the precursor reactants are zinc chloride to hexamethylene tetramine (HMTA) (all chemicals from Sigma-Aldrich), concentration is about 15 mmol in step (1), laser power density is determined and applied as 19.1 kW/cm$^2$ in step (2) and (3). In step (3), the total irradiation time is 30 s. In step (4), the precursor reactants are the same with step (1) and precursor concentration is changed to about 4 mmol. The minimum power density is determined as 9.55 kW/cm$^2$, maximum power density is 31.84 kW/cm$^2$. The laser power density applied in step (6) is at about 25.5 kW/cm$^2$, the total irradiation time is 2 min. After growth, the substrate was rinsed with DI water and dry.

Those having ordinary skill in the art will recognize that numerous modifications can be made to the specific implementations described above. The implementations should not be subjected to the particular limitations described. Other implementations are possible.

For example, the present method can be modified to precisely produce all materials that can be chemically synthesized, which must follow the thermodynamics and kinetics of chemistry where Gibbs Energy Barriers are key to determine the structures and morphology of a synthesized material. The proposed method can also be applied in a precursor solution without a substrate. Various pulsed laser conditions can be used to search feasible conditions for satisfying the Gibbs energy condition without knowing beforehand the values of the respective Gibbs Energy Barriers. When a particular structure and morphology are identified after using a laser condition, the condition is shown to be a feasible condition that can satisfy the respective Gibbs condition. A laser condition is a combination of laser fluence, irradiation area, repetition rate, width (duration) of a pulse, and total time (or the time for total number of pulses) for applying the laser condition. Thus, numerous laser conditions can be selected for achieving an intended synthesis for a structure/morphology. The substrate can also be modified to include many types of substrates including flexible substrates. The precursor condition includes precursor components, precursor concentration and pH value.

The invention claimed is:

1. A method of selectively growing crystals, comprising:
   selecting a precursor solution for crystals growth,
   applying the selected precursor solution onto a substrate with pre-nucleated crystal seeds;
   changing the precursor concentration to selectively associate with size of nucleating material seeds, wherein the concentration is inversely proportional to initial crystal size of the nucleated material seed, wherein the concentration varies between 6.16 to 27.10 mM associating in diameter of the initial crystal size varies between 1150 nm to 280 nm; and
   irradiating the pre-nucleated crystal seeds on the substrate through the precursor by a pulsed laser with a predetermined input energy, thereby growing crystal on the substrate and controlling nanocrystals' features of orientation, wherein the precursor solution contains precursor reactants of zinc chloride and hexamethylene tetramine (HMTA) with a content ratio of the precursor reactants zinc chloride and HMTA of 1:1.

2. The method of claim 1, wherein the precursor solution conditions includes precursor components, precursor concentration and pH value.

3. The method of claim 1, wherein the substrate is one of rigid, flexible, or combination thereof adapted to absorb the predetermined input energy.

4. The method of claim 1, wherein the pulsed laser is defined as laser conditions including pulse energy, laser irradiation area, repetition rate, pulse width, total time of pulsations, and combinations thereof.

5. The method of claim 4, wherein the predetermined input energy of pulsed laser is between a lower bound and an upper bound, in which the lower bound is determined by increasing the laser condition in a stepped manner until a first predetermined crystal size is detected in grown crystal, and in which the upper bound is determined by increasing the laser condition in a stepped manner until additional grown crystal occurs without any additional nucleation.

6. The method of claim 4, wherein the total pulsation time is selected based on a desired size of the crystal.

7. The method of claim 5, wherein a first desired crystal morphology is grown heterogeneously by pulsed laser with the predetermined input energy about the lower bound.

8. The method of claim 5, wherein a second crystal morphology is grown homogenously by pulsed laser with the predetermined input energy about the upper bound.

9. The method of claim 1, wherein the substrate is silicon.

* * * * *